(12) United States Patent
Kim

(10) Patent No.: US 12,387,801 B2
(45) Date of Patent: Aug. 12, 2025

(54) MEMORY DEVICE AND METHOD OF OPERATING THE MEMORY DEVICE

(71) Applicant: SK hynix Inc., Icheon-si (KR)

(72) Inventor: Jae Woong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 167 days.

(21) Appl. No.: 18/298,915

(22) Filed: Apr. 11, 2023

(65) Prior Publication Data

US 2024/0127898 A1 Apr. 18, 2024

(30) Foreign Application Priority Data

Oct. 12, 2022 (KR) .................. 10-2022-0130135

(51) Int. Cl.
*G11C 16/24* (2006.01)
*G11C 16/10* (2006.01)
*G11C 16/34* (2006.01)

(52) U.S. Cl.
CPC ........ *G11C 16/3459* (2013.01); *G11C 16/102* (2013.01); *G11C 16/24* (2013.01)

(58) Field of Classification Search
CPC ... G11C 16/3459; G11C 16/102; G11C 16/24; G11C 16/0483; G11C 11/5628; G11C 16/10; G11C 8/08; G11C 7/1078; G11C 7/12; G11C 16/3404
See application file for complete search history.

(56) References Cited

U.S. PATENT DOCUMENTS

| | | | |
|---|---|---|---|
| 2007/0297247 A1* | 12/2007 | Hemink ................. | G11C 16/12 365/195 |
| 2011/0194353 A1* | 8/2011 | Hwang .............. | G11C 16/3454 365/185.22 |
| 2012/0163092 A1* | 6/2012 | Jung ....................... | G11C 16/10 365/185.19 |
| 2018/0068739 A1* | 3/2018 | Shiino .................... | G11C 16/10 |
| 2023/0032133 A1* | 2/2023 | Park ................... | G11C 16/3427 |

FOREIGN PATENT DOCUMENTS

| | | |
|---|---|---|
| KR | 1020100106764 A | 10/2010 |
| KR | 1020150003969 A | 1/2015 |

* cited by examiner

*Primary Examiner* — Xiaochun L Chen
(74) *Attorney, Agent, or Firm* — WILLIAM PARK & ASSOCIATES LTD.

(57) ABSTRACT

Provided herein is a memory device and a method of operating the memory device. The memory device includes memory cells, a peripheral circuit configured to perform an intermediate program operation and a final program operation on the memory cells, and a program operation controller configured to control the peripheral circuit to perform an extra program operation, after the final program operation is performed, on under programmed cells having threshold voltages, lower than an extra verify voltage lower than a main verify voltage used in the final program operation among the memory cells.

18 Claims, 11 Drawing Sheets

FIG. 10

Program Order

| WL | DSL | Page | inter pgm | final pgm | extra pgm |
|---|---|---|---|---|---|
| WL1 | DSL1 | PG1 | 1 | 5 | 6 |
| WL1 | DSL2 | PG2 | 2 | 7 | 8 |
| WL2 | DSL1 | PG3 | 3 | 11 | 12 |
| WL2 | DSL2 | PG4 | 4 | 13 | 14 |
| WL3 | DSL1 | PG5 | 9 | 17 | 18 |
| WL3 | DSL2 | PG6 | 10 | 19 | 20 |
| WL4 | DSL1 | PG7 | 15 | 21 | 22 |
| WL4 | DSL2 | PG8 | 16 | 23 | 24 |

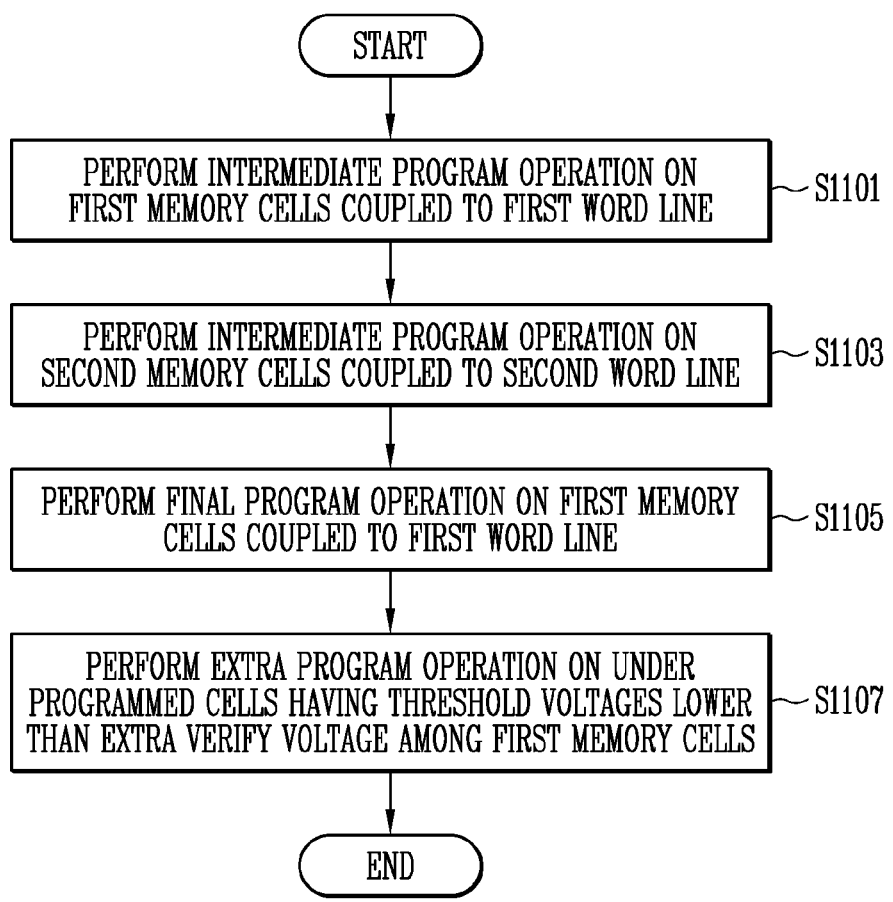

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2022-0130135, filed on Oct. 12, 2022, in the Korean Intellectual Property Office, the entire disclosure of which is incorporated herein by reference.

BACKGROUND

1. Technical Field

Various embodiments of the present disclosure generally relate to an electronic device, and more particularly to a memory device and a method of operating the memory device.

2. Related Art

A memory system is a device which stores data under the control of a host device such as a computer or a smartphone. The memory system may include a memory device in which data is stored and a memory controller which controls the memory device. Memory devices are classified into a volatile memory device and a nonvolatile memory device.

The nonvolatile memory device may be a memory device in which stored data is retained even when the supply of power is interrupted. Examples of the nonvolatile memory device may include a read only memory (ROM), a programmable ROM (PROM), an electrically programmable ROM (EPROM), an electrically erasable and programmable ROM (EEPROM), and a flash memory.

A program operation is an operation of storing data in memory cells included in the nonvolatile memory device. During the program operation, threshold voltages of the memory cells increase depending on the data to be stored in the memory cells. The threshold voltages of the memory cells, which have increased depending on the program operation, may decrease due to the influence of various factors such as time or noise. In order to increase the decreased threshold voltages of the memory cells, an additional (extra) program operation may be performed.

SUMMARY

An embodiment of the present disclosure may provide for a memory device. The memory device may include memory cells, a peripheral circuit configured to perform an intermediate program operation and a final program operation on the memory cells, and a program operation controller configured to control the peripheral circuit to perform, after the final program operation is performed, an extra program operation on under programmed cells having threshold voltages, lower than an extra verify voltage lower than a main verify voltage used in the final program operation among the memory cells.

An embodiment of the present disclosure may provide for a method of operating a memory device. The method may include performing an intermediate program operation on first memory cells coupled to a first word line, performing the intermediate program operation on second memory cells coupled to a second word line, performing a final program operation on the first memory cells, and performing an extra program operation on under programmed cells having threshold voltages, lower than an extra verify voltage lower than a main verify voltage used in the final program operation among the first memory cells.

An embodiment of the present disclosure may provide for a memory device. The memory device may include memory cells, a peripheral circuit configured to perform an intermediate program operation of increasing threshold voltages of the memory cells to threshold voltages corresponding to any one of intermediate program states, and a final program operation of increasing the threshold voltages of the memory cells to a threshold voltage corresponding to any one of target program states, and a program operation controller configured to control the peripheral circuit to perform, after the final program operation is performed, extra program operations of increasing threshold voltages of under programmed cells having threshold voltages lower than the threshold voltage corresponding to the one target program state among the memory cells.

BRIEF DESCRIPTION OF THE DRAWINGS

FIG. 10 is a diagram illustrating the order of performance of an intermediate program operation, a final program operation, and an extra program operation of a memory device.

FIG. 11 is a flowchart illustrating an intermediate program operation, a final program operation, and an extra program operation of a memory device.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a memory device that is capable of improving threshold voltage distributions of memory cells during a program operation, and a method of operating the memory device.

Figure 1:
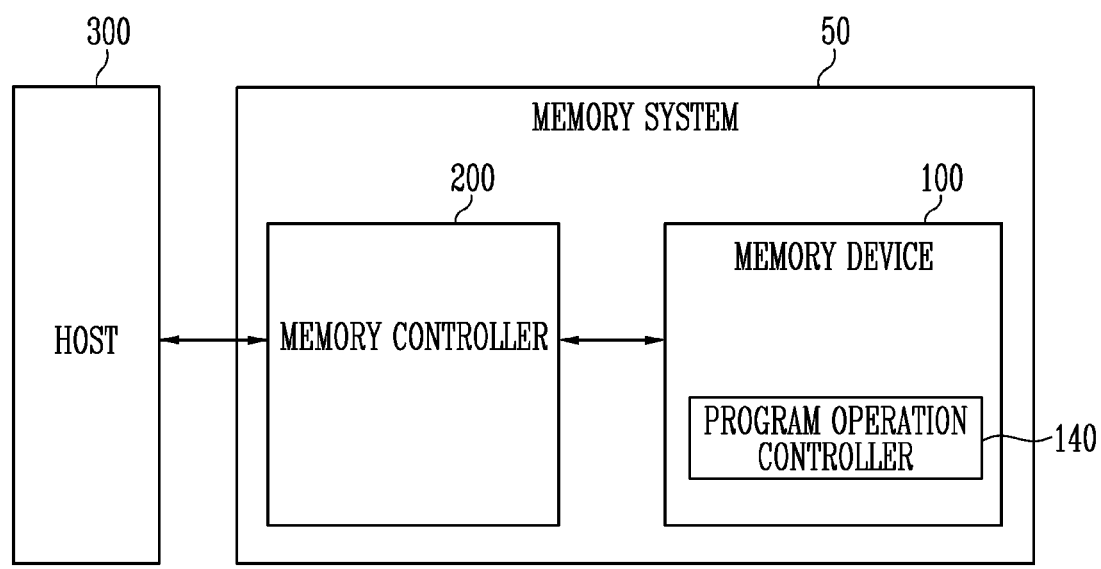
FIG. 1 is a diagram illustrating a memory system including a memory device according to an embodiment of the present disclosure.

FIG. 1 is a diagram illustrating a memory system including a memory device according to an embodiment of the present disclosure.

Referring to FIG. 1, a memory system 50 may include a memory device 100 and a memory controller 200. The memory system 50 may be a device included in a mobile phone, a smartphone, an MP3 player, a laptop computer, a desktop computer, a gaming console, a TV, a tablet PC, an in-vehicle infotainment system, or the like. The memory system 50 may be a device which stores data under the control of a host 300 located outside the memory system 50.

The memory system 50 may be manufactured as any one of various types of storage devices depending on a host interface that is a scheme for communication with the host 300. For example, the memory system 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The memory system 50 may be manufactured in any one of various types of package forms. For example, the memory system 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 may be operated in response to the control of the memory controller 200. The memory device 100 may include a memory cell array including a plurality of memory cells which store data.

In an embodiment, the memory device 100 may be implemented as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory, a resistive RAM (RRAM), a phase-change RAM (PRAM), a magnetoresistive RAM (MRAM), a ferroelectric RAM (FRAM), or a spin transfer torque RAM (SU-RAM).

The memory device 100 may receive a command and an address from the memory controller 200, and may access the area of the memory cell array, selected by the address. The memory device 100 may perform an operation indicated by the command on the area selected by the address. For example, the memory device 100 may perform a write operation (i.e., a program operation), a read operation, and an erase operation. The memory device 100 may program data to the area selected by the address, or may read or erase data stored in the area selected by the address.

In an embodiment, the memory device 100 may include a program operation controller 140. The program operation controller 140 may control a program operation performed on memory cells. The program operation may be an operation of increasing the threshold voltages of memory cells depending on the data to be stored in the memory cells.

The program operation may include an intermediate program operation, a final program operation, and an extra program operation. The intermediate program operation may be an operation of increasing the threshold voltages of memory cells to threshold voltages corresponding to any one of intermediate program states.

The final program operation may be an operation of increasing the threshold voltages of the memory cells to threshold voltages corresponding to any one of target program states. The target program states may be determined depending on the number of data bits stored in one memory cell. For example, when data is programmed according to a triple-level cell (TLC) scheme in which three bits of data are stored in one memory cell, the target program states may indicate an erased state and first to seventh program states. After the program operation is performed, the threshold voltages of the memory cells may be determined depending on the data to be stored in the memory cells. The threshold voltages of memory cells may increase to threshold voltages corresponding to any one of the target program states depending on the data to be stored in the memory cells.

The intermediate program operation and the final program operation may be operations performed while alternately selecting different word lines to reduce a phenomenon in which the threshold voltages of the memory cells are varied due to interference between word lines. For example, the memory device 100 may perform an intermediate program operation on first memory cells coupled to a first word line and perform an intermediate program operation on second memory cells coupled to a second word line adjacent to the first word line, and thereafter perform a final program operation on the first memory cells coupled to the first word line. Because the threshold voltages of the first memory cells coupled to the first word line may be varied while the threshold voltages of the second memory cells coupled to the second word line are increased, the intermediate program operation on the second memory cells coupled to the second word line is performed before the final program operation is performed on the first memory cells coupled to the first word line, thus decreasing a phenomenon in which the threshold voltages of the first memory cells are varied.

After the final program operation is performed, some of the memory cells may have threshold voltages corresponding to target program states only for a temporary time period, and the threshold voltages thereof may be decreased from the threshold voltages corresponding to the target program states. The program operation controller 140 may control an extra program operation of increasing the threshold voltages of memory cells which have decreased from the threshold voltages corresponding to the target program states, among the memory cells.

Each of the intermediate program operation, the final program operation, and the extra program operation may include a plurality of program loops. Each program loop may include a program voltage apply operation and a verify operation. The program voltage apply operation may be an operation of increasing the threshold voltages of memory cells using a program voltage. The verify operation may be an operation of identifying the threshold voltages of memory cells, which have been increased by the program voltage apply operation.

The memory controller 200 may control the overall operation of the memory system 50.

The memory controller 200 may control the memory device 100 so that a write operation, a read operation or an erase operation is performed in response to a request received from the host 300. The memory controller 200 may provide a command, an address or data to the memory device 100 depending on the write operation, the read operation or the erase operation.

In an embodiment, the memory controller 200 may internally generate a command, an address, and data regardless of whether a request from the host 300 is received, and may transmit them to the memory device 100. For example, the memory controller 200 may provide the memory device 100 with commands, addresses, and data required in order to perform read operations and write operations that are involved in performing wear leveling, read reclaim, garbage collection, etc.

In an embodiment, the memory controller 200 may control two or more memory devices 100. In this case, in an embodiment, the memory controller 200 may control the memory devices 100 depending on an interleaving scheme to improve operating performance. The interleaving scheme may be a scheme for controlling the memory devices 100 so that the operations of at least two memory devices 100 are caused to overlap each other.

The host 300 may communicate with the memory system 50 using at least one of various communication methods such as universal serial bus (USB), Serial AT Attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
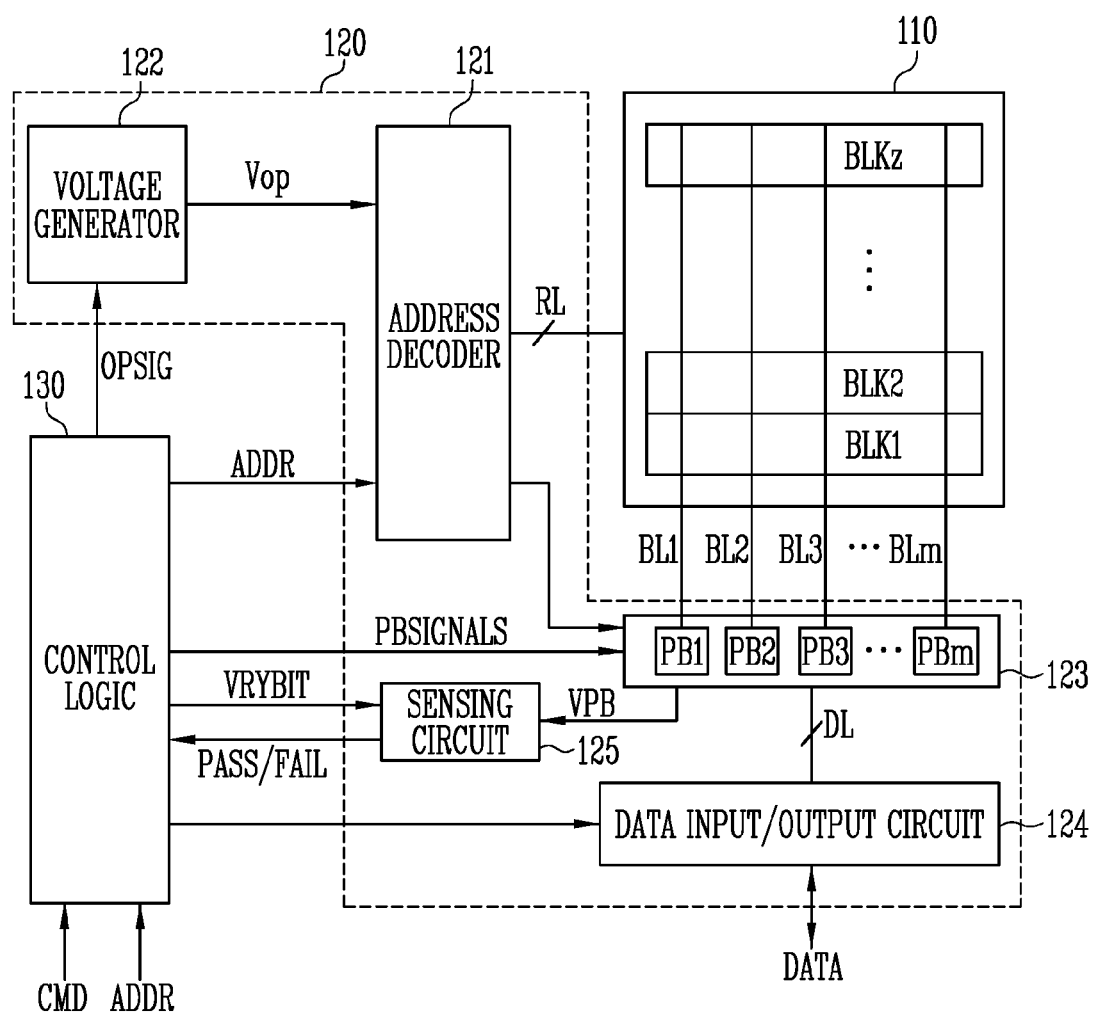
FIG. 2 is a diagram illustrating the structure of the memory device of FIG. 1.

FIG. 2 is a diagram illustrating the structure of the memory device of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 may include a plurality of memory blocks BLK1 to BLKz. The plurality of memory blocks BLK1 to BLKz may be coupled to an address decoder 121 through row lines RL. The plurality of memory blocks BLK1 to BLKz may be coupled to a page buffer group 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line, among the plurality of memory cells, may be defined as one page. That is, the memory cell array 110 may be composed of a plurality of pages. In an embodiment, a page may be the unit by which data is stored or stored data is read. A memory block may be the unit by which data is erased. In an embodiment of the present disclosure, each of the memory blocks BLK1 to BLKz included in the memory cell array 110 may include a plurality of dummy memory cells. For the dummy memory cells, one or more dummy memory cells may be coupled in series between a drain select transistor and memory cells and between a source select transistor and the memory cells.

Each of the memory cells of the memory device 100 may be implemented as a single-level cell (SLC) capable of storing one bit of data, a multi-level cell (MLC) capable of storing two bits of data, a triple-level cell (TLC) capable of storing three bits of data, a quad-level cell (QLC) capable of storing four bits of data, or a memory cell capable of storing five or more bits of data.

The peripheral circuit 120 may drive the memory cell array 110. In an example, the peripheral circuit 120 may drive the memory cell array 110 so that a program operation, a read operation, and an erase operation are performed under the control of the control logic 130. In an example, the peripheral circuit 120 may apply various operating voltages to the row lines RL and the bit lines BL1 to BLm or discharge the applied voltages under the control of the control logic 130.

The peripheral circuit 120 may include the address decoder 121, a voltage generator 122, the page buffer group 123, a data input/output circuit 124, and a sensing circuit 125.

The address decoder 121 may be coupled to the memory cell array 110 through the row lines RL. The row lines RL may include drain select lines, word lines, source select lines, and a source line. In an embodiment, the word lines may include normal word lines and dummy word lines. In an embodiment, the row lines RL may further include a pipe select line.

The address decoder 121 may be operated in response to the control of the control logic 130. The address decoder 121 may receive addresses ADDR from the control logic 130.

The address decoder 121 may decode a block address, among the received addresses ADDR. The address decoder 121 may select at least one of the memory blocks BLK1 to BLKz according to the decoded block address. The address decoder 121 may decode a row address, among the received addresses ADDR. The address decoder 121 may select at least one word line WL of the selected memory block by applying voltages supplied from the voltage generator 122 to the at least one word line WL according to the decoded row address.

During a program operation, the address decoder 121 may apply a program voltage to the selected word line and apply a pass voltage having a level lower than that of the program voltage to unselected word lines. During a program verify operation, the address decoder 121 may apply a verify voltage to the selected word line and apply a verify pass voltage having a level higher than that of the verify voltage to unselected word lines.

During a read operation, the address decoder 121 may apply a read voltage to the selected word line and apply a read pass voltage having a level higher than that of the read voltage to unselected word lines. The erase operation of the memory device 100 may be performed on a memory block basis. During the erase operation, addresses ADDR input to the memory device 100 may include a block address. The address decoder 121 may decode the block address and select one memory block according to the decoded block address. During the erase operation, the address decoder 121 may apply a ground voltage to word lines coupled to the selected memory block.

The address decoder 121 may decode a column address among the received addresses ADDR. The decoded column address may be transferred to the page buffer group 123. In an embodiment, the address decoder 121 may include components such as a row decoder, a column decoder, and an address buffer.

The voltage generator 122 may generate a plurality of operating voltages Vop using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage generated by the voltage generator 122 may be used as an operating voltage for the memory device 100.

In an embodiment, the voltage generator 122 may generate various operating voltages Vop that are used for program, read, and erase operations in response to an operation signal OPSIG. The voltage generator 122 may generate the plurality of operating voltages Vop using the external supply voltage or the internal supply voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors for receiving the internal supply voltage so as to generate a plurality of operating voltages Vop having various voltage levels, and may generate the plurality of operating voltages Vop by selectively enabling the plurality of pumping capacitors under the control of the control logic 130.

The generated operating voltages Vop may be supplied to the memory cell array 110 by the address decoder 121.

The page buffer group 123 may include first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may be operated under the control of the control logic 130.

The first to m-th page buffers PB1 to PBm may transmit/receive data DATA to/from the data input/output circuit 124. During a program operation, the first to m-th page buffers PB1 to PBm may receive data DATA to be stored through the data input/output circuit 124 and data lines DL.

During a program operation, the first to m-th page buffers PB1 to PBm may transfer data DATA, received through the data input/output circuit 124, to selected memory cells through the bit lines BL1 to BLm. The memory cells in the selected page may be programmed based on the received data DATA. Memory cells coupled to a bit line to which a program-enable voltage (e.g., a ground voltage) is applied may have increased threshold voltages. The threshold voltages of memory cells coupled to a bit line to which a program-inhibit voltage (e.g., a supply voltage) is applied may be maintained. During a verify operation, the first to m-th page buffers PB1 to PBm may read the data DATA stored in the selected memory cells from the selected memory cells through the bit lines BL1 to BLm.

During a read operation, the page buffer group 123 may read data DATA from the memory cells in the selected page through the bit lines BL1 to BLm, and may store the read data DATA in the first to m-th page buffers PB1 to PBm.

During an erase operation, the page buffer group 123 may allow the bit lines BL1 to BLm to float. In an embodiment, the page buffer group 123 may include a column select circuit.

In an embodiment, while pieces of data stored in some of the plurality of page buffers included in the page buffer group 123 are being programmed to the memory cell array 110, the remaining page buffers may receive new data from the memory controller 200 and then store the new data.

The data input/output circuit 124 may be coupled to the first to m-th page buffers PB1 to PBm through the data lines DL. The data input/output circuit 124 may be operated under the control of the control logic 130.

The data input/output circuit 124 may include a plurality of input/output buffers (not illustrated) which receive input data DATA. During a program operation, the data input/output circuit 124 may receive the data DATA to be stored from an external controller (not illustrated). During a read operation, the data input/output circuit 124 may output the data DATA, received from the first to m-th page buffers PB1 to PBm included in the page buffer group 123, to the external controller.

During a read operation or a verify operation, the sensing circuit 125 may generate a reference current in response to an enable bit signal VRYBIT generated by the control logic 130, and may output a pass signal or a fail signal to the control logic 130 by comparing a sensing current VPB received from the page buffer group 123 with the reference current. In an example, the sensing circuit 125 may output a fail signal to the control logic 130 when the magnitude of the sensing current VPB is greater than that of the reference current. In an example, the sensing circuit 125 may output a pass signal to the control logic 130 when the magnitude of the sensing current VPB is less than that of the reference current.

The control logic 130 may be coupled to the address decoder 121, the voltage generator 122, the page buffer group 123, the data input/output circuit 124, and the sensing circuit 125. The control logic 130 may control the overall operation of the memory device 100. The control logic 130 may be operated in response to a command CMD transferred from an external device.

The control logic 130 may control the peripheral circuit 120 by generating various types of signals in response to the command CMD and addresses ADDR. For example, the control logic 130 may generate the operation signal OPSIG, the addresses ADDR, page buffer control signals PBSIGNALS, and the enable bit signal VRYBIT in response to the command CMD and the addresses ADDR. The control logic 130 may output the operation signal OPSIG to the voltage generator 122, may output the addresses ADDR to the address decoder 121, may output the page buffer control signals PBSIGNALS to the page buffer group 123, and may output the enable bit VRYBIT to the sensing circuit 125. In addition, the control logic 130 may determine whether a verify operation has passed or failed in response to the pass or fail signal PASS or FAIL output from the sensing circuit 125.

In an embodiment, the control logic 130 may include the program operation controller 140 illustrated in FIG. 1. The program operation controller 140 may control the peripheral circuit so that an intermediate program operation, a final program operation, and an extra program operation are performed on the memory cells. The program operation controller 140 may control the peripheral circuit 120 to apply program voltages and verify voltages, which are used in each of the intermediate program operation, the final program operation, and the extra program operation, to the word lines. The program operation controller 140 may control the peripheral circuit 120 to apply a program-enable voltage, a program control voltage, and a program-inhibit voltage, which are used in each of the intermediate program operation, the final program operation, and the extra program operation, to the bit lines.

Figure 3:
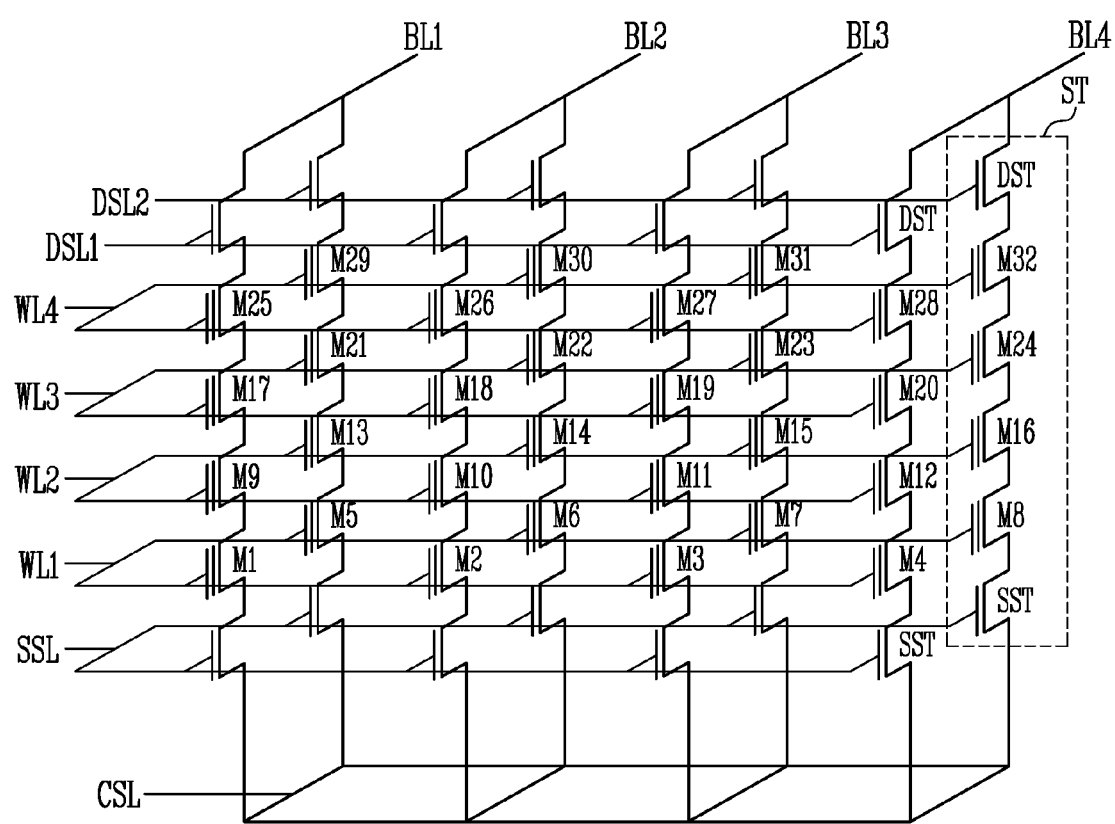
FIG. 3 is a diagram illustrating the structure of any one of a plurality of memory blocks BLK1 to BLKz of FIG. 2.

FIG. 3 is a diagram illustrating the structure of any one of the plurality of memory blocks BLK1 to BLKz of FIG. 2.

Referring to FIG. 3, the memory block may include a plurality of memory cell strings. Each of the memory cell strings ST may include at least one drain select transistor DST, a plurality of memory cells, and at least one source select transistor SST. The plurality of memory cells may be coupled in series between the drain select transistor DST and the source select transistor SST. Respective memory cells included in one memory cell string ST may be coupled to different word lines. For example, an eighth memory cell M8 included in one memory cell string ST may be coupled to a first word line WL1, a sixteenth memory cell M16 may be coupled to a second word line WL2, a 24-th memory cell M24 may be coupled to a third word line WL3, and a 32-th memory cell M32 may be coupled to a fourth word line WL4.

Individual memory cell strings ST may be coupled to a common source line CSL. Each memory cell string ST may be coupled to any one of a plurality of bit lines BL1 to BL4. Each memory cell string ST may be coupled to a drain select line DSL1 or DSL2, a plurality of word lines WL1 to WL4, and a source select line SSL. The drain select line DSL1 or DSL2 may be used as a gate electrode of the drain select transistor DST. The plurality of word lines WL1 to WL4 may be used as gate electrodes of the plurality of memory cells.

A plurality of memory cell strings may be coupled to each of the bit lines BL1 to BL4. Each of the plurality of memory cell strings coupled to one bit line may be coupled to the first drain select line DSL1 or the second drain select line DSL2. In an embodiment, two memory cell strings may be coupled to one bit line.

Memory cells coupled to one word line may constitute a plurality of physical pages. The number of physical pages included in one word line may be determined depending on the number of memory cell strings coupled in common to one bit line. For example, when two memory cell strings are coupled in common to one bit line, one word line may include two physical pages. In detail, for example, first to fourth memory cells M1 to M4 may constitute one physical page, and fifth to eighth memory cells M5 to M8 may constitute one physical page.

One physical page may include a plurality of logical pages. The number of logical pages included in one physical page may be determined depending on the number of bits to be stored in each memory cell. For example, when each memory cell is programmed according to a TLC scheme, one physical page may include three logical pages. The three logical pages may include a least significant bit (LSB) page, a central significant bit (CSB) page, and a most significant bit (MSB) page.

The numbers of word lines, memory cell strings, bit lines, and memory cells illustrated in FIG. 3 may be provided for convenience of description, and may be less than or greater than those illustrated in FIG. 3.

Figure 4:
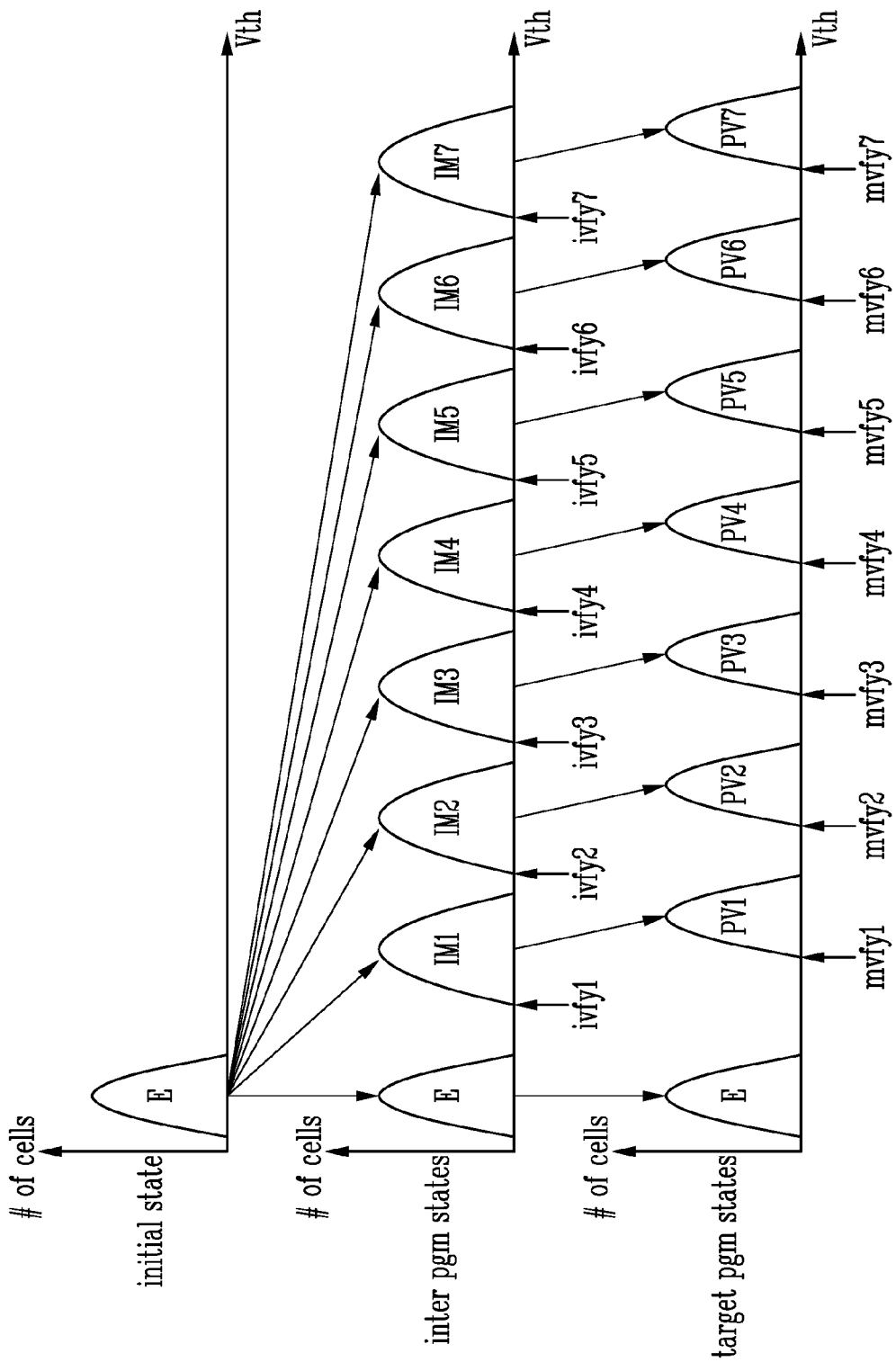
FIG. 4 is a diagram illustrating threshold voltage distributions of memory cells depending on an intermediate program operation and a final program operation of a memory device.

FIG. 4 is a diagram illustrating threshold voltage distributions of memory cells depending on an intermediate program operation and a final program operation of a memory device.

In FIG. 4, the horizontal axis of each graph indicates threshold voltages Vth of memory cells, and the vertical axis thereof indicates the number of memory cells (# of cells).

In FIG. 4, a description is made based on the case where memory cells are programmed according to a TLC scheme in which three bits of data are stored in one memory cell by way of example.

Referring to FIG. 4, threshold voltages of memory cells may be increased by the intermediate program operation and the final program operation. The threshold voltage distributions of the memory cells may be changed from an initial state to intermediate program states (inter pgm states) depending on the intermediate program operation, and may be changed from the intermediate program states (inter pgm states) to target program states (target pgm states) depending on the final program operation.

The initial state may be the state in which a program operation is not performed and in which the threshold voltage distributions of the memory cells are in an erase state E.

The intermediate program states (inter pgm states) may be the program states of the memory cells on which the intermediate program operation is performed. Each of the memory cells may have a threshold voltage corresponding to the erased state E or any one of first to seventh intermediate program states IM1 to IM7 through the intermediate program operation. For example, the threshold voltages of memory cells to be programmed to a first program state PV1 in the final program operation may increase to threshold voltages corresponding to the first intermediate program state IM1. The threshold voltages of the memory cells to be programmed to second to seventh program states PV2 to PV7, respectively, in the final program operation may increase to threshold voltages corresponding to second to seventh intermediate program states IM2 to IM7.

The intermediate program operation may include an intermediate verify operation of identifying whether the threshold voltages of memory cells have increased to threshold voltages corresponding to the first to seventh intermediate program states IM1 to IM7 using intermediate verify voltages ivfy1 to ivfy7. The intermediate verify voltages ivfy1 to ivfy7 may be voltages respectively corresponding to the first to seventh intermediate program states IM1 to IM7.

The target program states (target pgm states) may be the program states of the memory cells on which the final program operation is performed. In an embodiment, the target program states may indicate the erased state E and the first to seventh program states PV1 to PV7. Each of the memory cells may have a threshold voltage corresponding to the erased state E or any one of first to seventh program states PV1 to PV7 through the final program operation. The target program states of the memory cells may be determined depending on the data to be stored in respective memory cells. After the final program operation is performed, the widths of target program states, which are threshold voltage distributions of the memory cells, may be narrower than those of the intermediate program states.

The final program operation may include a main verify operation of identifying whether the threshold voltages of the memory cells have increased to threshold voltages corresponding to the first to seventh program states PV1 to PV7 using main verify voltages mvfy1 to mvfy7. The main verify voltages mvfy1 to mvfy7 may be voltages respectively corresponding to the first to seventh program states PV1 to PV7.

Figure 5:
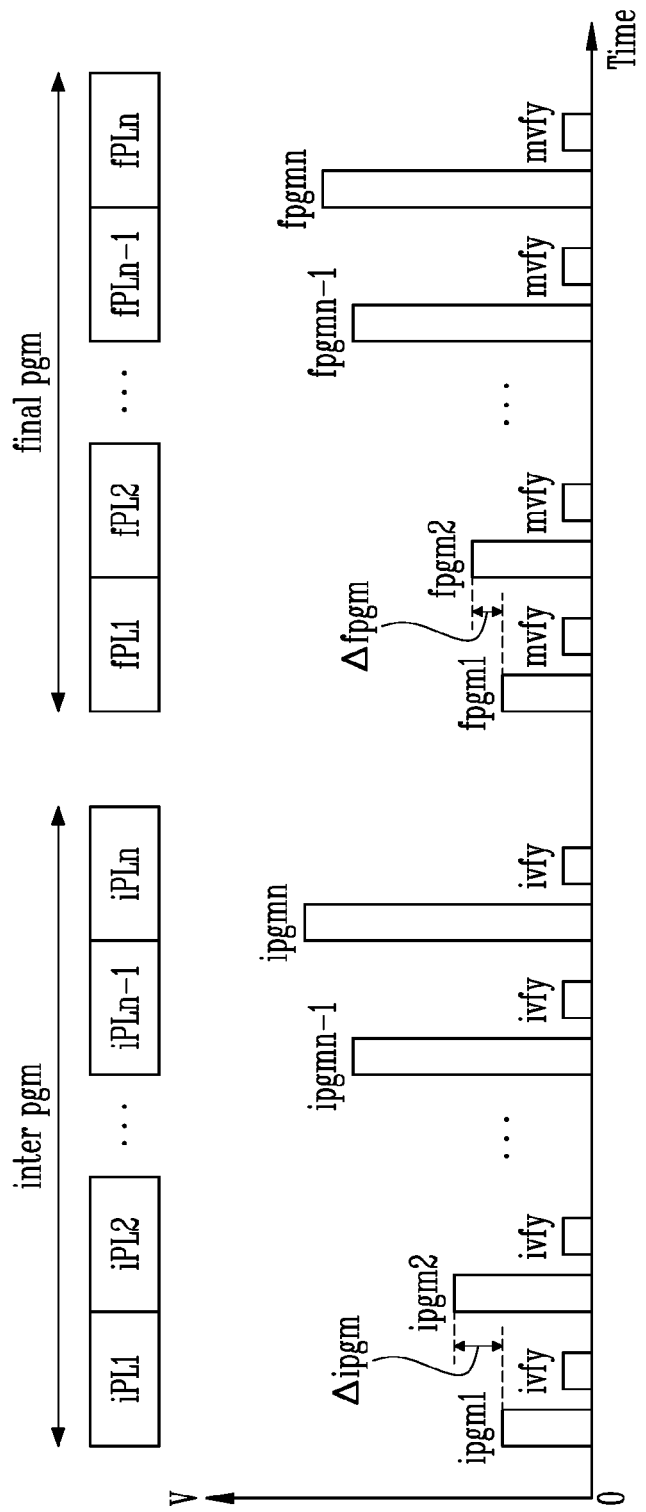
FIG. 5 is a diagram illustrating an intermediate program operation and a final program operation of a memory device.

FIG. 5 is a diagram illustrating an intermediate program operation and a final program operation of a memory device.

In FIG. 5, the horizontal axis of a graph indicates time and the vertical axis thereof indicates voltage V applied to word lines.

Referring to FIG. 5, the memory device may perform a final program operation (final pgm) on selected memory cells after performing an intermediate program operation (inter pgm) on the selected memory cells. The intermediate program operation (inter pgm) may include a plurality of intermediate program loops iPL1 to iPLn.

Each intermediate program loop may include an intermediate program apply operation and an intermediate verify operation. The intermediate program apply operation may be an operation of increasing the threshold voltages of the selected memory cells by applying an intermediate program voltage ipgm to a selected word line coupled to the selected memory cells. The intermediate verify operation may be an operation of identifying whether the threshold voltages of the selected memory cells have increased to threshold voltages corresponding to any one of intermediate program states by applying an intermediate verify voltage ivfy to the selected word line. In an embodiment, the intermediate verify voltage ivfy may be any one of the intermediate verify voltages ivfy1 to ivfy7 illustrated in FIG. 4. The intermediate verify voltage ivfy may be an intermediate verify voltage corresponding to any one of intermediate program states to which the threshold voltages of the selected memory cells need to be increased.

In an embodiment, in the first intermediate program loop iPL1, the memory device 100 may increase the threshold voltages of selected memory cells using a first intermediate program voltage ipgm1, and may then identify the threshold voltages of the selected memory cells using the intermediate verify voltage ivfy.

When the threshold voltages of the selected memory cells are lower than the intermediate verify voltage ivfy, the memory device 100 may perform the second intermediate program loop iPL2. In the second intermediate program loop iPL2, the memory device 100 may increase the threshold voltages of selected memory cells using a second intermediate program voltage ipgm2 higher than the first intermediate program voltage ipgm1 by an intermediate step voltage Δipgm, and may then identify the threshold voltages of the selected memory cells using the intermediate verify voltage ivfy. When the threshold voltages of the selected memory cells are lower than the intermediate verify voltage ivfy, the memory device 100 may perform the third intermediate program loop iPL3 in the same manner as the first and second intermediate program loops iPL1 and iPL2. In an embodiment, when respective threshold voltages of the selected memory cells increase to threshold voltages corresponding to the intermediate program states, the intermediate program operation may be terminated.

The magnitude of the corresponding intermediate program voltage may be determined based on an incremental step pulse programming (ISPP) method. The magnitude of the intermediate program voltage may be increased by the intermediate step voltage Δipgm depending on the number of intermediate program loops that are performed.

The memory device 100 may perform a plurality of intermediate program loops iPL1 to iPLn so that the threshold voltages of the selected memory cells increase to threshold voltages corresponding to the intermediate program states.

The memory device 100 may perform a final program operation (final pgm) on the selected memory cells after performing an intermediate program operation (inter pgm) on the selected memory cells. The final program operation (final pgm) may include a plurality of final program loops fPL1 to fPLn.

Similar to the intermediate program loops, each final program loop may include a final program voltage apply operation of increasing the threshold voltage of a selected word line by applying a final program voltage fpgm to the selected word line, and a main verify operation of identifying whether the threshold voltages of the selected memory cells have increased to threshold voltages corresponding to any one of target program states by applying a main verify voltage mvfy to the selected word line. In an embodiment, the main verify voltage mvfy may be any one of the main verify voltages mvfy1 to mvfy7 illustrated in FIG. 4. The main verify voltage mvfy may be a main verify voltage corresponding to any one of target program states to which the selected memory cells need to be increased.

In an embodiment, in the first final program loop fPL1, the memory device 100 may increase the threshold voltages of selected memory cells using a first final program voltage fpgm1, and may then identify the threshold voltages of the selected memory cells using the main verify voltage mvfy.

When the threshold voltages of the selected memory cells are lower than the main verify voltage mvfy, the memory device 100 may perform the second final program loop fPL2. In the second final program loop fPL2, the memory device 100 may increase the threshold voltages of selected memory cells using a second final program voltage fpgm2 higher than the first final program voltage fpgm1 by a final step voltage Δfpgm, and may then identify the threshold voltages of the selected memory cells using the main verify voltage mvfy. When the threshold voltages of the selected memory cells are lower than the main verify voltage mvfy, the memory device 100 may perform the third final program loop fPL3 in the same manner as the first and second final program loops fPL1 and fPL2. The memory device 100 may perform a plurality of final program loops fPL1 to fPLn so that the threshold voltages of the selected memory cells increase to threshold voltages corresponding to the target program states. In an embodiment, when respective threshold voltages of the selected memory cells increase to threshold voltages corresponding to the target program states, the final program operation may be terminated.

The magnitude of the final program voltage may be determined based on an incremental step pulse programming (ISPP) method. The magnitude of the final program voltage may be increased by the final step voltage Δfpgm depending on the number of final program loops that are performed. The magnitude of the final step voltage Δfpgm may be lower than that of the intermediate step voltage Δipgm. That is, the degree to which the threshold voltages of the selected memory cells in the final program operation increase may be less than the degree to which the threshold voltages of the selected memory cells increase in the intermediate program operation.

Figure 6:
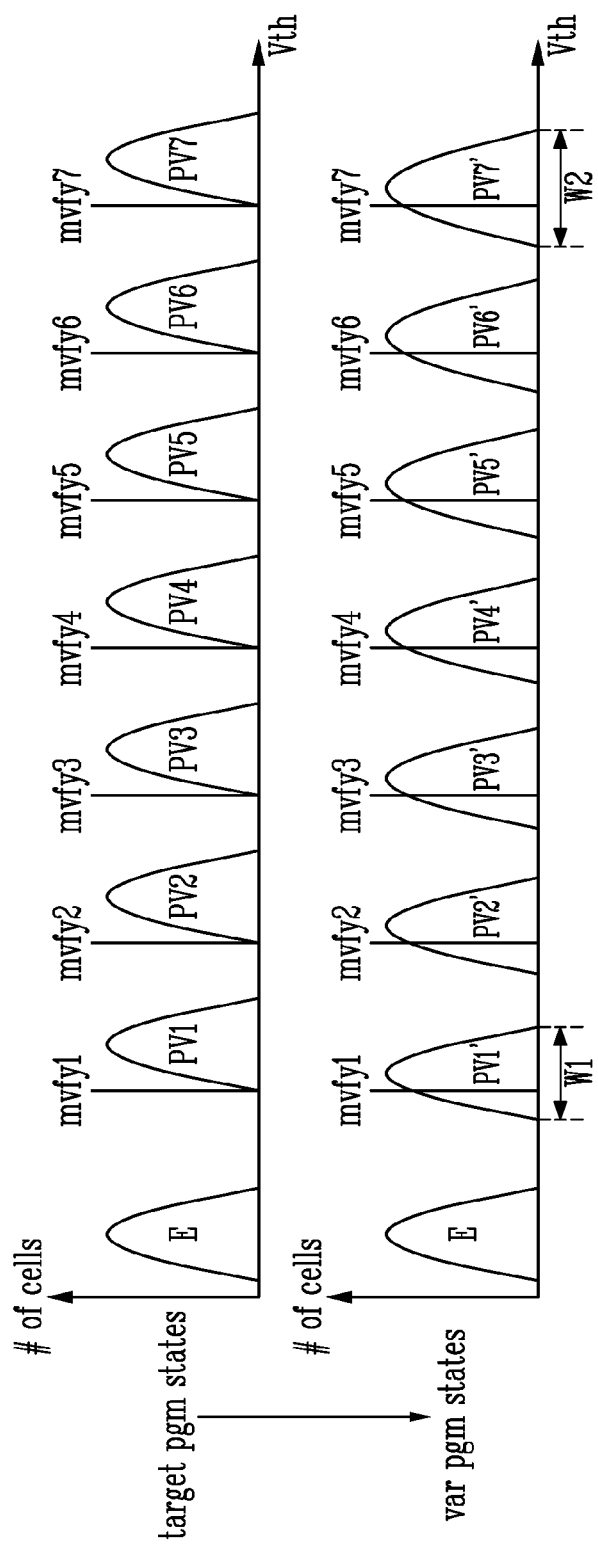
FIG. 6 is a diagram illustrating threshold voltage distributions of memory cells varied after the final program operation is performed.

FIG. 6 is a diagram illustrating threshold voltage distributions of memory cells varied after the final program operation is performed.

In FIG. 6, the horizontal axis of each graph indicates threshold voltages Vth of memory cells, and the vertical axis thereof indicates the number of memory cells (# of cells).

Referring to FIG. 6, after a final program operation is performed, threshold voltage distributions of memory cells may be changed from the erased state E and first to seventh program states PV1 to PV7, which are target program states, to the erased state E and first to seventh program states PV1' to PV7', which are varied program states (var pgm states).

Although the memory cells perform the final program operation to have threshold voltages higher than main verify voltages mvfy1 to mvfy7 respectively corresponding to the first to seventh program states PV1 to PV7, there may be a large number of memory cells which maintain threshold voltages corresponding to the first to seventh program states PV1 to PV7 only for a certain time period. Accordingly, after the final program operation is performed, the threshold voltage distributions of the memory cells may be changed to varied program states (var pgm states) in which memory cells having threshold voltages lower than the main verify voltage are present.

Furthermore, after the final program operation is performed, the degree to which the threshold voltage distributions of the memory cells are changed may be greater as the program state is higher. In detail, the widths of the varied program states may be greater as the program state is higher. For example, among the varied first to seventh program states PV1' to PV7', the varied first program state may have the narrowest width W1, and the varied seventh program state may have the widest width W2.

Accordingly, after the memory device 100 performs the final program operation, it may perform an extra program operation to increase the threshold voltages of memory cells, which are decreased from threshold voltages corresponding to the target program state or from the main verify voltages, among the memory cells.

Figure 7:
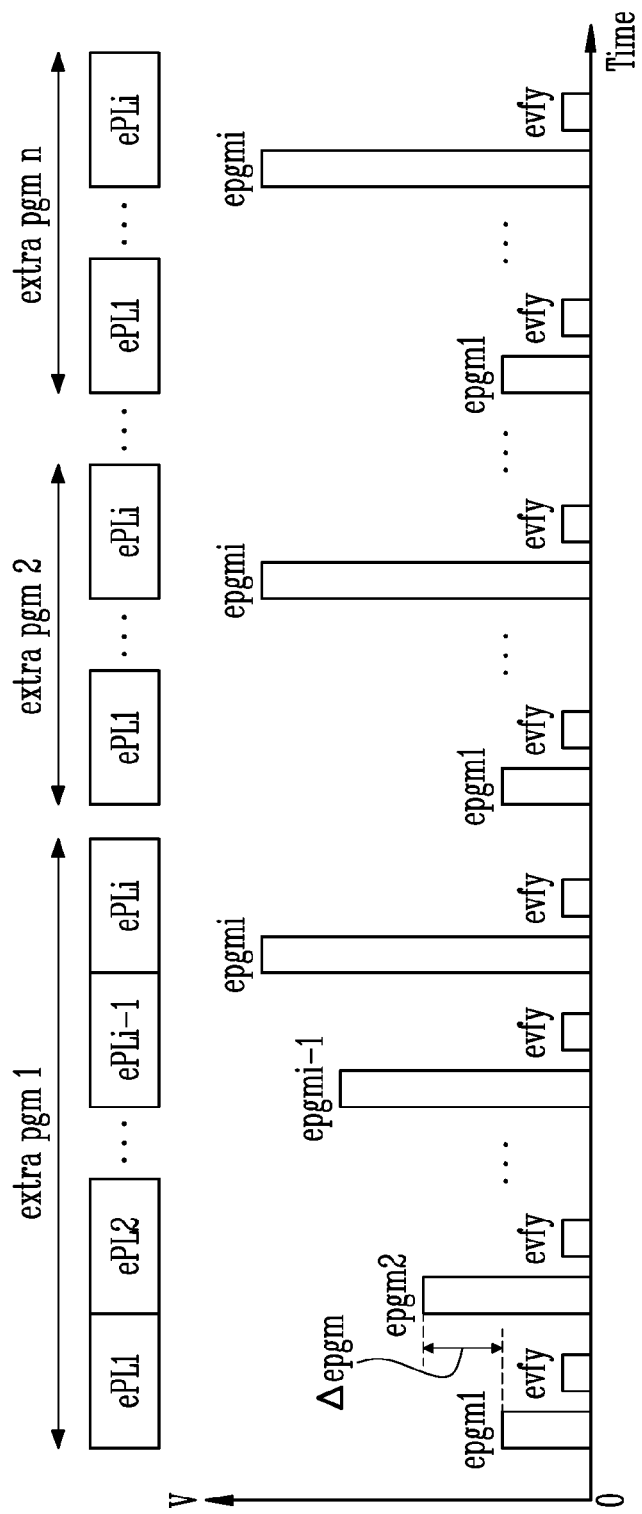
FIG. 7 is a diagram illustrating an extra program operation of a memory device.

FIG. 7 is a diagram illustrating an extra program operation of a memory device.

In FIG. 7, the horizontal axis of a graph indicates time and the vertical axis thereof indicates voltage V applied to word lines.

Referring to FIG. 7, the memory device 100 performs an intermediate program operation and a final program operation on selected memory cells, after which the memory device 100 may perform an extra program operation (extra pgm). The extra program operation (extra pgm) may be an operation of increasing the threshold voltages of under programmed cells having threshold voltages lower than an extra verify voltage evfy, among the selected memory cells. The extra verify voltage evfy may be a voltage lower than or equal to the main verify voltage used in the main verify operation of the final program operation.

The extra program operation (extra pgm) may be performed a plurality of times. In an embodiment, when the extra program operation is performed n times, first to n-th extra program operations (extra pgm 1 to extra pgm n) may be performed on under programmed cells.

Each of the first to n-th extra program operations (extra pgm 1 to extra pgm n) may include a plurality of extra program loops ePL1 to ePLi. Each extra program loop may include an extra program voltage apply operation of applying an extra program voltage epgm to a selected word line and then increasing the threshold voltages of under programmed cells, and an extra verify operation of applying an extra verify voltage evfy to the selected word line and then identifying the threshold voltages of the under programmed cells.

In an embodiment, in the first extra program loop ePL1, the memory device 100 may identify the threshold voltages of under programmed cells by applying a first extra program voltage epgm1 to the selected word line and thereafter applying the extra verify voltage evfy to the selected word line. When the threshold voltages of the under programmed cells are lower than the extra verify voltage evfy, the memory device 100 may perform the second extra program loop ePL2.

In the second extra program loop ePL2, the memory device may identify the threshold voltages of the under programmed cells by applying a second extra program voltage epgm2, higher than the first extra program voltage epgm1 by an extra step voltage Δepgm, to the selected word line and thereafter applying the extra verify voltage evfy to the selected word line. When the threshold voltages of the under programmed cells are lower than the extra verify voltage, the memory device may perform a third extra program loop ePL3 in the same manner as the first and second extra program loops ePL1 and ePL2.

The magnitude of the extra program voltage may be determined based on an incremental step pulse programming (ISPP) method. The magnitude of the extra program voltage may be increased by the extra step voltage Δepgm in a stepwise manner depending on the number of extra program loops that are performed. The magnitude of the extra step voltage Δepgm may be greater than those of the final step voltage Δfpgm and the intermediate step voltage Δipgm illustrated in FIG. 5.

After performing the final program operation, the memory device 100 may rapidly increase the threshold voltages of the under programmed cells using each extra program voltage that is increased depending on the extra step voltage Δepgm higher than the final step voltage Δfpgm and the intermediate step voltage Δipgm.

In an embodiment, the memory device 100 may perform a first extra program operation (extra pgm 1) including i extra program loops. In the extra program operation, since the magnitude of the extra step voltage Δepgm may be greater than that of the final step voltage Δfpgm and the intermediate step voltage Δipgm, the number of extra program loops included in the extra program operation may be less than the number of intermediate program loops included in the intermediate program operation and the number of final program loops included in the final program operation. In an embodiment, the number of extra program loops included in the extra program operation may be less than the number of intermediate program loops included in the intermediate program operation. In an embodiment, the number of extra program loops included in the extra program operation may be less than the number of final program loops included in the final program operation.

The memory device 100 may perform second to n-th extra program operations (extra pgm 2 to extra pgm n) in the same manner as the first extra program operation (extra pgm 1) so that the threshold voltages of the under programmed cells become higher than the extra verify voltage evfy.

Figure 8:
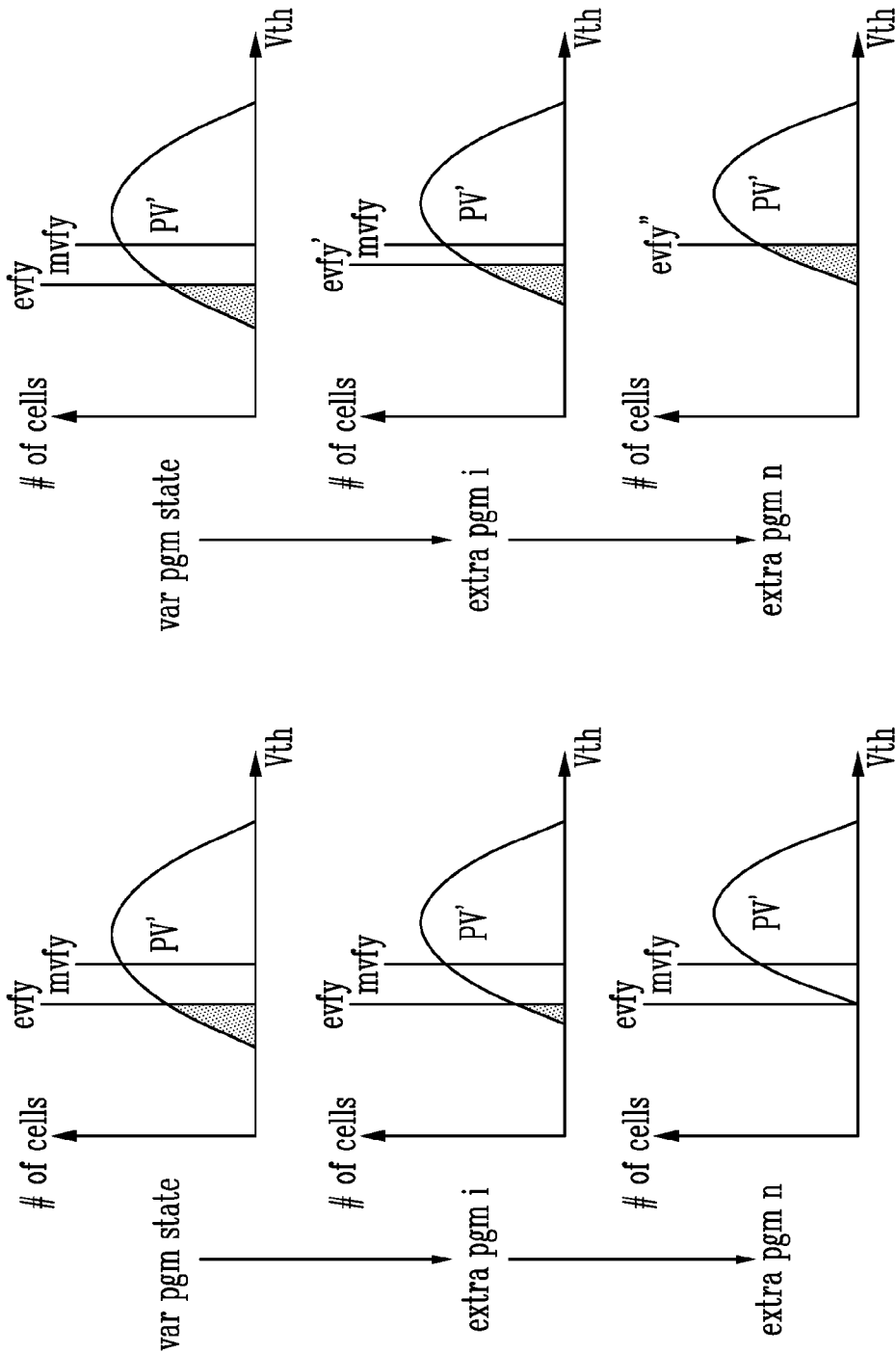
FIG. 8 is a diagram illustrating an extra program operation of a memory device using an extra verify voltage.

FIG. 8 is a diagram illustrating an extra program operation of a memory device using an extra verify voltage.

The horizontal axis of each graph illustrated in FIG. 8 indicates threshold voltages Vth of memory cells, and the vertical axis thereof indicates the number of memory cells (# of cells).

The threshold voltage distributions of memory cells illustrated in graphs of FIG. 8 indicate any one varied program state PV' of the varied first to seventh program states PV1' to PV7' in FIG. 6. The upper graphs in FIG. 8 may indicate the varied threshold voltage distributions of memory cells after a final program operation is performed. The middle graphs in FIG. 8 may indicate the threshold voltage distributions of the memory cells on which an extra program operation is performed i times. The lower graphs in FIG. 8 may indicate the threshold voltage distributions of the memory cells on which an extra program operation is performed n times.

Referring to FIG. 8, through the use of an extra verify voltage evfy lower than a main verify voltage mvfy used in a final program operation, the memory device 100 may perform an extra program operation on under programmed cells which have threshold voltages lower than the extra verify voltage evfy. In an embodiment, the main verify voltage mvfy may be a main verify voltage corresponding to each varied program state. For example, when the varied program state PV' is a seventh program state PV7', the main verify voltage mvfy may be a seventh main verify voltage mvfy7, and the extra verify voltage evfy may be a voltage lower than the seventh main verify voltage mvfy7.

In an embodiment, referring to the upper left graph of FIG. 8, the memory device 100 may perform an extra program operation on under programmed cells so that threshold voltages of the under programmed cells become higher than the extra verify voltage efvy. In detail, during the extra program operation, the memory device 100 may apply a program-enable voltage to bit lines coupled to under programmed cells having threshold voltages lower than the extra verify voltage efvy and apply a program-inhibit voltage to bit lines coupled to memory cells having threshold voltages higher than the extra verify voltage efvy while applying the extra program voltage to the selected word line. In an embodiment, the memory device 100 may perform the extra program operation on the under programmed cells i times.

In an embodiment, referring to the middle left graph of FIG. 8, under programmed cells having threshold voltages lower than the extra verify voltage evfy may still exist even after the extra program operation is performed i times. Thereafter, the memory device 100 may additionally perform the extra program operation.

In an embodiment, referring to the lower left graph of FIG. 8, under programmed cells having threshold voltages lower than the extra verify voltage evfy might not exist after the extra program operation is performed n times. Accordingly, the memory device 100 may terminate the performance of the extra program operation.

In an embodiment, referring to upper, middle, and lower graphs on the right side of FIG. 8, the memory device 100 may increase the magnitude of the extra verify voltage efvy as the number of times that the extra program operation is performed increases. In an embodiment, when the extra program operation is performed n times, the magnitude of an extra verify voltage evfy" used in an n-th extra program operation (extra pgm n) may be equal to that of the main verify voltage mvfy.

The memory device 100 may identify a certain percentage of memory cells, among all memory cells, as under programmed cells in each extra program operation, and may increase the magnitude of the extra verify voltage so that the extra program operation is performed on the under programmed cells. In detail, the number of under programmed cells having threshold voltages lower than the extra verify voltage evfy in the upper right graph of FIG. 8, the number of under programmed cells having threshold voltages lower than the extra verify voltage evfy' in the middle right graph of FIG. 8, and the number of under programmed cells having threshold voltages lower than the extra verify voltage evfy" in the lower right graph of FIG. 8 may be equal to each other.

In an embodiment, the memory device 100 may perform an extra program operation only on under programmed cells having program states, higher than a threshold program state, as target program states, among program states to which the under programmed cells belong. After the final program operation is performed, the degree to which the threshold voltage distribution of the memory cells is varied increases as the program state is higher, and thus the memory device 100 may perform an extra program operation only on under programmed cells belonging to higher program states indicating the threshold program state. For example, when the threshold program state is the fourth program state, the memory device 100 may perform an extra program operation only on under programmed cells belonging to fifth to seventh program states.

Figure 9:
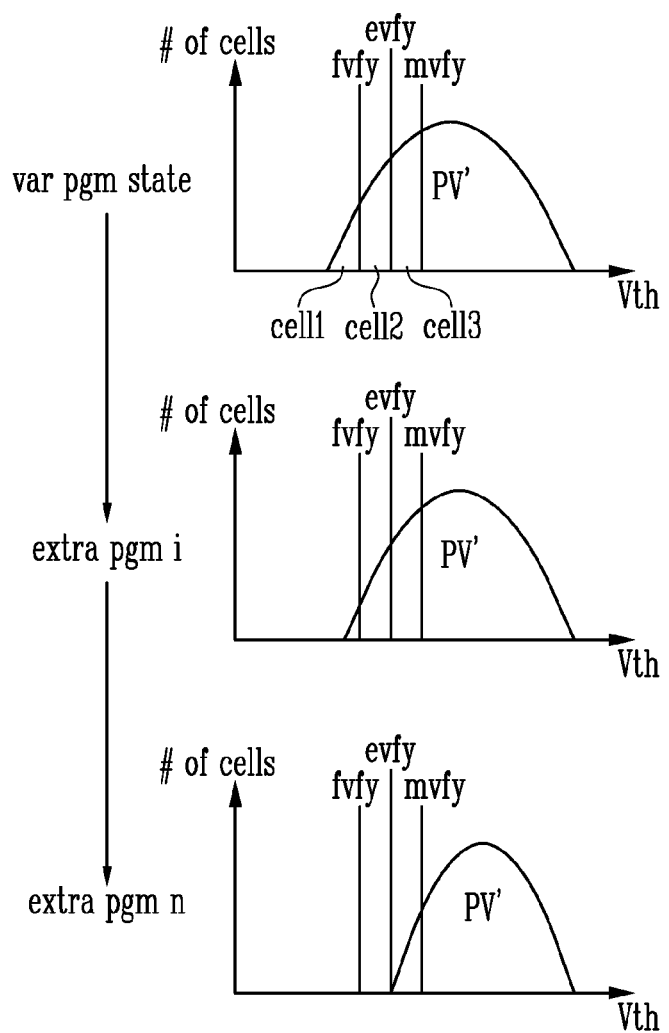
FIG. 9 is a diagram illustrating an extra program operation of a memory device using an extra verify voltage and a pre-verify voltage.

FIG. 9 is a diagram illustrating an extra program operation of a memory device using an extra verify voltage and a pre-verify voltage.

The horizontal axis of each graph illustrated in FIG. 9 indicates threshold voltages Vth of memory cells, and the vertical axis thereof indicates the number of memory cells (# of cells).

The threshold voltage distributions of memory cells illustrated in graphs of FIG. 9 indicate any one varied program state PV' of the varied first to seventh program states PV1' to PV7' in FIG. 6.

Referring to FIG. 9, during the extra program operation, the memory device 100 may control the degree to which the threshold voltages of under programmed cells are increased depending on the threshold voltages of the under programmed cells identified using a main verify voltage mvfy, an extra verify voltage evfy, and a pre-verify voltage fvfy lower than the extra verify voltage.

Referring to the upper graph of FIG. 9, the threshold voltage of a first cell cell1 may be lower than a pre-verify voltage fvfy. The threshold voltage of a second cell cell2 may be higher than the pre-verify voltage fvfy and lower than the extra verify voltage evfy. The threshold voltage of a third cell cell3 may be higher than the extra verify voltage evfy and lower than the main verify voltage mvfy.

In an embodiment, because the first cell cell1 and the second cell cell2 may have threshold voltages lower than the extra verify voltage evfy, they may be under programmed cells on which the extra program operation needs to be performed. Because the first cell cell1 has the threshold voltage lower than that of the second cell cell2, the threshold voltage of the first cell cell1 needs to be increased more than that of the second cell cell2 during the extra program operation. Accordingly, the memory device 100 may apply a program-enable voltage to a bit line coupled to the second cell cell2 during the extra program operation. In an embodiment, the program-enable voltage may be a ground voltage.

In an embodiment, because the second cell cell2 has the threshold voltage higher than that of the first cell cell1, the threshold voltage of the second cell cell2 needs to be increased less than that of the first cell cell1 during the extra program operation. Accordingly, the memory device 100 may apply a program control voltage to a bit line coupled to the second cell cell2 during the extra program operation. In an embodiment, the program control voltage may be higher than the ground voltage and lower than a supply voltage.

In an embodiment, the third cell cell3 might not be an under programmed cell because the threshold voltage thereof is higher than that of the extra verify voltage. That is, since the third cell cell3 is not an under programmed cell, the threshold voltage thereof should not be increased during the extra program operation. Accordingly, the memory device 100 may apply a program-inhibit voltage to a bit line coupled to the third cell cell3 during the extra program operation. In an embodiment, the program-inhibit voltage may be a supply voltage.

The memory device 100 may set the voltage to be applied to the bit lines to different voltages depending on the threshold voltages of under programmed cells identified based on the extra verify voltage evfy and the pre-verify voltage fvfy during the extra program operation. The memory device 100 may perform the extra program operation a plurality of times using the extra verify voltage evfy and the pre-verify voltage fvfy. In an embodiment, after the extra program operation is performed n times, the extra program operation may be terminated unless there are under programmed cells having threshold voltages lower than the extra verify voltage evfy.

FIG. 10 is a diagram illustrating the order of performance of an intermediate program operation, a final program operation, and an extra program operation of a memory device.

In FIG. 10, a description will be made with reference to FIG. 3. The memory device 100 may perform an intermediate program operation (inter pgm), a final program operation (final pgm), and an extra program operation (extra pgm) depending on the order described in FIG. 10.

Referring to FIGS. 3 and 10, memory cells selected by different drain select lines, among memory cells coupled to one word line, may constitute different physical pages. For example, first to fourth memory cells coupled to the first word line WL1 and selected by the first drain select line DSL1 may constitute a first physical page PG1. Also, fifth to eighth memory cells coupled to the first word line WL1 and selected by the second drain select line DSL2 may constitute a second physical page PG2. In the same manner, memory cells coupled to second to fourth word lines WL2 to WL4 may be divided into different physical pages by drain select lines.

The numbers 1 to 24 under columns 'inter pgm', 'final pgm', and 'extra pgm' shown in FIG. 10 indicate the order in which operations are performed on the pages. For example, first, the memory device 100 may sequentially perform an intermediate program operation on first and second physical pages PG1 and PG2 (i.e., 1 then 2) included in the first word line WL1 and an intermediate program operation on third and fourth physical pages PG3 and PG4 (i.e., 3 and 4) included in the second word line WL2. Thereafter, the memory device 100 may sequentially perform a final program operation and an extra program operation on the first physical page PG1 (i.e., 5 and 6) and a final program operation and an extra program operation on the second physical page PG2 (i.e., 7 and 8). In an embodiment, the extra program operation may be performed a plurality of times. The intermediate program operation and the final program operation may be performed while alternately selecting first and second word lines WL1 and WL2 in order to minimize variation in the threshold voltages of memory cells due to interference between word lines.

Thereafter, after the memory device may sequentially perform intermediate program operations on fifth and sixth physical pages PG5 and PG6 included in the third word line WL3, it may sequentially perform a final program operation and an extra program operation on a third physical page PG3 included in the second word line WL2, and may sequentially perform a final program operation and an extra program operation on the fourth physical page PG4.

In the same manner, the memory device 100 may perform intermediate program operations on seventh and eighth physical pages PG7 and PG8 included in the fourth word line WL4, and thereafter respectively perform a final program operation and an extra program operation on the fifth and sixth physical pages PG5 and PG6 included in the third word line WL3.

Thereafter, when the intermediate program operations are performed on all physical pages, a final program operation and an extra program operation may be respectively performed on the seventh and eighth physical pages PG7 and PG8 included in the fourth word line WL4, which is the last word line.

FIG. 11 is a flowchart illustrating an intermediate program operation, a final program operation, and an extra program operation of a memory device.

Referring to FIG. 11, at step S1101, the memory device 100 may perform an intermediate program operation on first memory cells coupled to a first word line. The intermediate program operation may be an operation of increasing the threshold voltages of memory cells to threshold voltages corresponding to any one of intermediate program states.

At step S1103, the memory device 100 may perform an intermediate program operation on second memory cells coupled to a second word line.

At step S1105, the memory device 100 may perform a final program operation on the first memory cells coupled to the first word line. The final program operation may be an operation of increasing the threshold voltages of the memory cells to threshold voltages corresponding to any one of target program states depending on the data to be stored in the memory cells.

At step S1107, the memory device 100 may perform an extra program operation on under programmed cells having threshold voltages lower than an extra verify voltage, among the first memory cells. The extra verify voltage may be a voltage lower than or equal to a main verify voltage used in the final program operation. In an embodiment, the extra program operation may be performed a plurality of times.

In accordance with the present disclosure, in various embodiments, there are provided a memory device that is capable of improving threshold voltage distributions of memory cells during a program operation, and a method of operating the memory device.

What is claimed is:

1. A memory device, comprising:
   memory cells;
   a peripheral circuit configured to perform an intermediate program operation and a final program operation on the memory cells; and
   a program operation controller configured to control the peripheral circuit to perform, after the final program operation is performed, extra program operations, wherein each of the extra program operations comprises a plurality of extra program loops, on under programmed cells having threshold voltages lower than an extra verify voltage, which is lower than a main verify voltage used in the final program operation among the memory cells,
   wherein the program operation controller, during an extra program loop, applies an extra program voltage to the memory cells and identifies under programmed cells having threshold voltages lower than an extra verify voltage after applying the extra program voltage,
   wherein the extra verify voltage is increased based on a number of times that an extra program operation is performed.

2. The memory device according to claim 1, wherein the program operation controller is configured to control the peripheral circuit to perform, before the final program operation is performed on the memory cells, the intermediate program operation on memory cells coupled to an additional word line different from that of the memory cells.

3. The memory device according to claim 1, wherein a magnitude of the extra program voltage is increased by an extra step voltage based on a number of times that the plurality of extra program loops are performed.

4. The memory device according to claim 3, wherein a magnitude of the extra step voltage is greater than a magnitude by which a final program voltage used in the final program operation is increased.

5. The memory device according to claim 1, wherein the intermediate program operation is an operation of increasing threshold voltages of the memory cells to threshold voltages corresponding to any one of intermediate program states.

6. The memory device according to claim 1, wherein the final program operation is an operation of increasing threshold voltages of the memory cells to a threshold voltage corresponding to any one of target program states.

7. The memory device according to claim 6, wherein the extra program operations are performed for the under programmed cells that are memory cells having a target program state higher than a threshold program state among the target program states.

8. The memory device according to claim 1, wherein the program operation controller is configured to control the peripheral circuit to apply, during the extra program operation, a program control voltage higher than a ground voltage to a bit line coupled to a first memory cell having a threshold voltage, higher than a pre-verify voltage, lower than the extra verify voltage among the under programmed cells while an extra program voltage is applied to a word line coupled to the under programmed cells.

9. The memory device according to claim 8, wherein the program operation controller is configured to control the peripheral circuit to apply a program-enable voltage to a bit line coupled to a second memory cell having a threshold voltage lower than the pre-verify voltage among the under programmed cells while the extra program voltage is applied to the word line.

10. The memory device according to claim 1, wherein the extra program operation is performed a plurality of times to increase the threshold voltages of the under programmed cells to a voltage higher than the extra verify voltage.

11. A method of operating a memory device, comprising:
performing an intermediate program operation on first memory cells coupled to a first word line;
performing the intermediate program operation on second memory cells coupled to a second word line;
performing a final program operation on the first memory cells; and
performing extra program operations, wherein each of the extra program operations comprises a plurality of extra program loops, on under programmed cells having threshold voltages, lower than an extra verify voltage, which is lower than a main verify voltage used in the final program operation among the first memory cells,
wherein performing an extra program operation comprises: applying an extra program voltage to the memory cells and identifying under programmed cells having threshold voltages, which is lower than an extra verify voltage after applying the extra program voltage during an extra program loop,
wherein the extra verify voltage increases based on the number of times an extra program operation is performed.

12. The method according to claim 11, wherein a magnitude of the extra program voltage is increased by an extra step voltage based on a number of times that the plurality of extra program loops are performed.

13. The method according to claim 12, wherein:
the intermediate program operation comprises a plurality of intermediate program loops, and
a magnitude of an intermediate program voltage used in the intermediate program operation is increased by an intermediate step voltage based on a number of times that the plurality of intermediate program loops are performed.

14. The method according to claim 13, wherein a magnitude of the extra step voltage is greater than that of the intermediate step voltage.

15. The method according to claim 13, wherein the number of times that the plurality of extra program loops are performed is less than the number of times that the plurality of intermediate program loops are performed.

16. A memory device, comprising:
memory cells;
a peripheral circuit configured to perform an intermediate program operation of increasing threshold voltages of the memory cells to threshold voltages corresponding to any one of intermediate program states, and a final program operation of increasing the threshold voltages of the memory cells to a threshold voltage corresponding to any one of target program states; and
a program operation controller configured to control the peripheral circuit to perform, after the final program operation is performed, extra program operations of increasing threshold voltages of under programmed cells having threshold voltages lower than the threshold voltage corresponding to the one target program state among the memory cells,
wherein each of the extra program operations comprises a plurality of extra program loops,
wherein the program operation controller, during an extra program loop, applies an extra program voltage to the memory cells and identifies under programmed cells having threshold voltages lower than an extra verify voltage after applying the extra program voltage,
wherein the extra verify voltage increases based on the number of times an extra program operation is performed.

17. The memory device according to claim 16, wherein the program operation controller is configured to control the peripheral circuit to apply, during the extra program operation, a program-enable voltage to bit lines respectively coupled to the under programmed cells while an extra program voltage is applied to a word line coupled to the memory cells.

18. The memory device according to claim 16, wherein the program operation controller is configured to control the peripheral circuit to apply, during the extra program operation, a program-inhibit voltage to bit lines respectively coupled to memory cells other than the under programmed cells among the memory cells while an extra program voltage is applied to a word line coupled to the memory cells.

* * * * *